United States Patent [19]
Yoshida

[11] Patent Number: 5,998,843
[45] Date of Patent: *Dec. 7, 1999

[54] SEMICONDUCTOR DEVICE WITH STABLE THRESHOLD VOLTAGES

[75] Inventor: Hiroshi Yoshida, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/744,931

[22] Filed: Nov. 6, 1996

[30] Foreign Application Priority Data

Nov. 6, 1995 [JP] Japan ..................... 7-287137

[51] Int. Cl.$^6$ ........................ H01L 29/76; H01L 29/94; H01L 31/062; H01L 31/113
[52] U.S. Cl. ............................................. 257/370
[58] Field of Search .............................. 257/370

[56] References Cited

FOREIGN PATENT DOCUMENTS 6-268166  9/1994  Japan .
6-350035  12/1994  Japan .

OTHER PUBLICATIONS

Wolf et al, "Silicon Processing for the VLSI Era" vol. 3, pp. 588–589, © 1986.
Hsu et al, "Hot Electron Degradation in Submicron VLSI", IEDM 1985 pp. 48–51, 1985.
Muller et al, *Device Electronics for IC's* , pp. 462–463, 1986.

*Primary Examiner*—Stephen D. Meier
*Attorney, Agent, or Firm*—Sughrue, Mion, Zinn Macpeak & Seas, PLLC

[57] ABSTRACT

A semiconductor device includes complementary first and second MOS transistors of different conductivity types and a bipolar transistor which are formed on a common substrate. The first MOS transistor has a first gate electrode of a polysilicon layer doped with impurities of a first conductivity type and a second conductivity type. A concentration of the impurities of the first conductivity type is higher than that of the second conductivity type. The second MOS transistor has a second gate electrode of a polysilicon layer doped with impurities of the second conductivity type, and the bipolar transistor has an emitter electrode of a polysilicon layer doped with impurities of the second conductivity type. The impurities of the second conductivity type doped into the polysilicon layers of the second gate electrode and the emitter electrode may include one kind of impurity ions or two different kinds of impurity ions, while the impurities of the second conductivity type doped into the polysilicon layer of the first gate electrode includes one kind of impurity ions.

4 Claims, 12 Drawing Sheets

SEMICONDUCTOR DEVICE WITH STABLE THRESHOLD VOLTAGES

BACKGROUND OF THE INVENTION

The present invention relates to a hybrid LSI (large scale integrated circuit) having CMOS (complementary metal oxide semiconductor) transistors and bipolar transistors formed on a common substrate and, in particular, to structures of gate electrodes of the MOS transistors and emitter electrodes of the bipolar transistors and a method of fabricating them.

Recently, attention has been given to a BiCMOS technology. The BiCMOS technology is used for forming bipolar transistors, capable of controlling the large current, and CMOS transistors, suitable for high-level integration, on the same chip. The BiCMOS technology is known as a method of achieving low-level voltage and acceleration of the LSI including digital and analog circuits. However, in the BiCMOS technology, since the bipolar transistors and the CMOS transistors are formed on the same chip, the number of processes is likely to cause increase in fabrication cost.

In view of this, various proposals have been made for reducing the number of fabrication processes, for example, as disclosed in a paper entitled "An Advanced Single-Level Polysilicon Submicrometer BiCMOS Technology" by Michael P. Brassington et al, IEEE TRANSACTIONS ON ELECTRON DEVICES, Vol. 36, No. Apr. 4, 1989, pp. 712–719.

One of the proposals will be described hereinbelow.

An n-type epitaxial layer is first grown on a silicon substrate of a p conductivity type which is formed in advance with $n^+$ buried layers and $p^+$ buried layers. Then, using the LOCOS (local oxidation of substrate) method, field oxidized films are formed. Subsequently, n-type well regions, p-type well regions, $^+n$ -type collector leading regions and base regions of bipolar transistors are formed. Then, just after formation of gate oxidized films, each in a thickness of 50 to 200 angstroms, of NMOS and PMOS transistors, a polysilicon layer is grown to a thickness of 500 to 1,000 angstroms. This polysilicon layer is provided for preventing a problem, such as a resistance failure of the gate oxidized films due to contamination or damage thereof in a subsequent process of forming emitter contacts.

Subsequently, the polysilicon layer and the gate oxidized film at emitter regions of the bipolar transistors are etched to form the emitter contacts, and then another polysilicon layer is deposited to a thickness of 1,000 to 2,000 angstroms over the whole area.

Subsequently, the upper and lower polysilicon layers are etched to form gate electrodes of the NMOS transistors, gate electrodes of the PMOS transistors and emitter electrodes of the bipolar transistors. Thereafter, an oxidized film is deposited to a thickness of 1,000 angstroms, and then anisotropic dry etching is performed so as to form sand walls on the sides of each of the gate electrodes and the emitter electrodes. Subsequently, boron is doped through ion implantation at concentration of $5 \times 10^{15}$ cm$^{-2}$ to $7 \times 10^{15}$ cm$^{-2}$ into source and drain regions and the gate electrodes of the PMOS transistors and external base regions of the bipolar transistors. On the other hand, arsenic is doped through ion implantation at concentration of $1 \times 10^{16}$ cm$^{-2}$ to $2 \times 10^{16}$ cm$^{-2}$ into source and drain regions and the gate electrodes of the NMOS transistors and the emitter electrodes. Thereafter, the heat treatment is applied in the nitrogen atmosphere at 850 to 900° C. so as to activate the implanted impurities. Then, at the gate electrodes of the PMOS transistors, boron diffuses from the upper polysilicon layers into the lower polysilicon layers so that the p-type gate electrodes are formed. On the other hand, at the gate electrodes of the NMOS transistors, arsenic diffuses from the upper polysilicon layers into the lower polysilicon layers so that the n-type gate electrodes are formed. Further, at the emitter electrodes of the bipolar transistors, arsenic diffuses from the upper polysilicon layers into the n-type epitaxial layer so that emitter regions of the bipolar transistors are formed.

In the foregoing conventional example, the gate electrodes and the emitter electrodes are formed by the same polysilicon two-layers, respectively, the source and drain regions of the PMOS transistors and the external base regions of the bipolar transistors are formed through the same process, and the source and drain regions of the NMOS transistors and the emitter electrodes of the bipolar transistors are formed through the same process, so as to achieve simplification of the fabrication processes.

However, the semiconductor device thus fabricated and the fabrication method thereof have the following problems.

At the p-type gate electrode of the PMOS transistor, boron implanted into the upper polysilicon layer and diffused into the lower polysilicon layer further diffuses into the silicon substrate via the gate oxidized layer (known boron punch-through). This may cause dispersion of threshold voltages of the PMOS transistors. Further, the as boron punch-through is accelerated depending on the heat treatment atmosphere or temperature, or presence of fluorine in polysilicon. Thus, the fabrication process after introduction of boron into the gate electrode may be limited in various ways.

Further, since formation of a resist mask and removal of the resist mask are required in the process of forming the emitter contact after formation of the lower polysilicon layer, a spontaneous oxidized thin film is formed on the surface of the lower polysilicon layer. This oxidized film causes the following disadvantage onto the NMOS transistor. Specifically, the oxidized film works as a barrier when the impurities doped into the upper polysilicon layer of the gate electrode diffuse into the lower polysilicon layer. Thus, the oxidized film prevents uniform redistribution of the impurities into the upper and lower polysilicon layers so that the impurity concentration in the lower polysilicon layer is lowered. When the impurity concentration in the lower polysilicon layer is low, a depletion layer expands in the lower polysilicon layer upon application of the voltage across the gate electrode to turn on the NMOS transistor. Thus, a channel is not fully formed in the silicon substrate so that the characteristic of the NMOS transistor is lowered. On the other hand, at the emitter portion of the bipolar transistor, the impurities are prevented from fully diffusing from the lower polysilicon layer near the emitter contact into the emitter region so that the so-called plug effect becomes significant to reduce the impurities around the emitter contact. This lowers the current amplification factor and increases the emitter resistance.

SUMMARY OF THE INVENTION

Therefore, it is an object of the present invention to provide an improved semiconductor device.

It is another object of the present invention to provide an improved method of fabricating a semiconductor device.

According to one aspect of the present invention, a semiconductor device comprises complementary first and second MOS transistors of different conductivity types and a bipolar transistor formed on a common substrate, wherein the first MOS transistor has a first gate electrode of a polysilicon layer doped with impurities of a first conductivity type and a second conductivity type, a concentration of the impurities of the first conductivity type is higher than that of the second conductivity type, the second MOS transistor has a second gate electrode of a polysilicon layer doped with impurities of the second conductivity type, and the bipolar transistor has an emitter electrode of a polysilicon layer doped with impurities of the second conductivity type.

It may be arranged that the impurities of the second conductivity type comprise a kind of impurity ions.

It may be arranged that the impurities of the second conductivity type doped into the polysilicon layer of at least the second gate electrode comprise two different kinds of impurity ions.

It may be arranged that each of the polysilicon layers of the first and second electrodes and the emitter electrode comprises a first sublayer and a second sublayer overlying the first sublayer.

It may be arranged that the impurities of the second conductivity type doped into the polysilicon layer of the second gate electrode comprise two different kinds of impurity ions, while the impurities of the second conductivity type doped into the polysilicon layer of the first gate electrode comprise a single kind of impurity ions.

It may be arranged that the two different kinds of impurity ions include the single kind of impurity ions.

According to another aspect of the present invention, a method of fabricating a semiconductor device having a CMOS transistor portion and a bipolar transistor portion formed on a common substrate, comprises the steps of forming a first polysilicon layer on insulating films at the CMOS transistor portion and the bipolar transistor portion, the insulating films working as gate insulating films for the CMOS transistor portion, and the first polysilicon layer containing first impurities of a first conductivity type; forming a second polysilicon layer over an entire area after forming a contact hole through the first polysilicon layer and the insulating film at least at the bipolar transistor portion; forming the first and second polysilicon layers into gate electrodes of a first and a second conductivity type of the CMOS transistor portion and an emitter electrode of the bipolar transistor portion through etching; and introducing impurities into the first and second polysilicon layers.

It may be arranged that, in the step of introducing the impurities into the first and second polysilicon layers, impurities of the second conductivity type at a concentration higher than the first impurities of the first conductivity type are introduced into the first and second polysilicon layers of the gate electrode of the second conductivity type, and the first impurities of the first conductivity type are introduced into the first and second polysilicon layers of the gate electrode of the first conductivity type and the emitter electrode.

It may be arranged that, in the step of introducing the impurities into the first and second polysilicon layers, impurities of the second conductivity type at a concentration higher than the first impurities of the first conductivity type are introduced into the first and second polysilicon layers of the gate electrode of the second conductivity type, and second impurities of the first conductivity type are introduced into the first and second polysilicon layers of the gate electrode of the first conductivity type and the emitter electrode, the first and second impurities of the first conductivity type being different in kind from each other.

It may be arranged that, in the step of forming the first polysilicon layer containing the first impurities of the first conductivity type, the first impurities of the first conductivity type are introduced simultaneously with forming the first polysilicon layer.

It may be arranged that, in the step of forming the first polysilicon layer containing the first impurities of the first conductivity type, the first impurities of the first conductivity type are introduced into the first polysilicon layer through ion implantation after depositing the first polysilicon layer.

DESCRIPTION OF THE PREFERRED EMBODIMENT

Prior to description of preferred embodiments, a known method of fabricating a semiconductor device having a BiCMOS structure will be described with reference to FIGS. 1 to 4 for facilitating understanding of the present invention.

Figure 1:
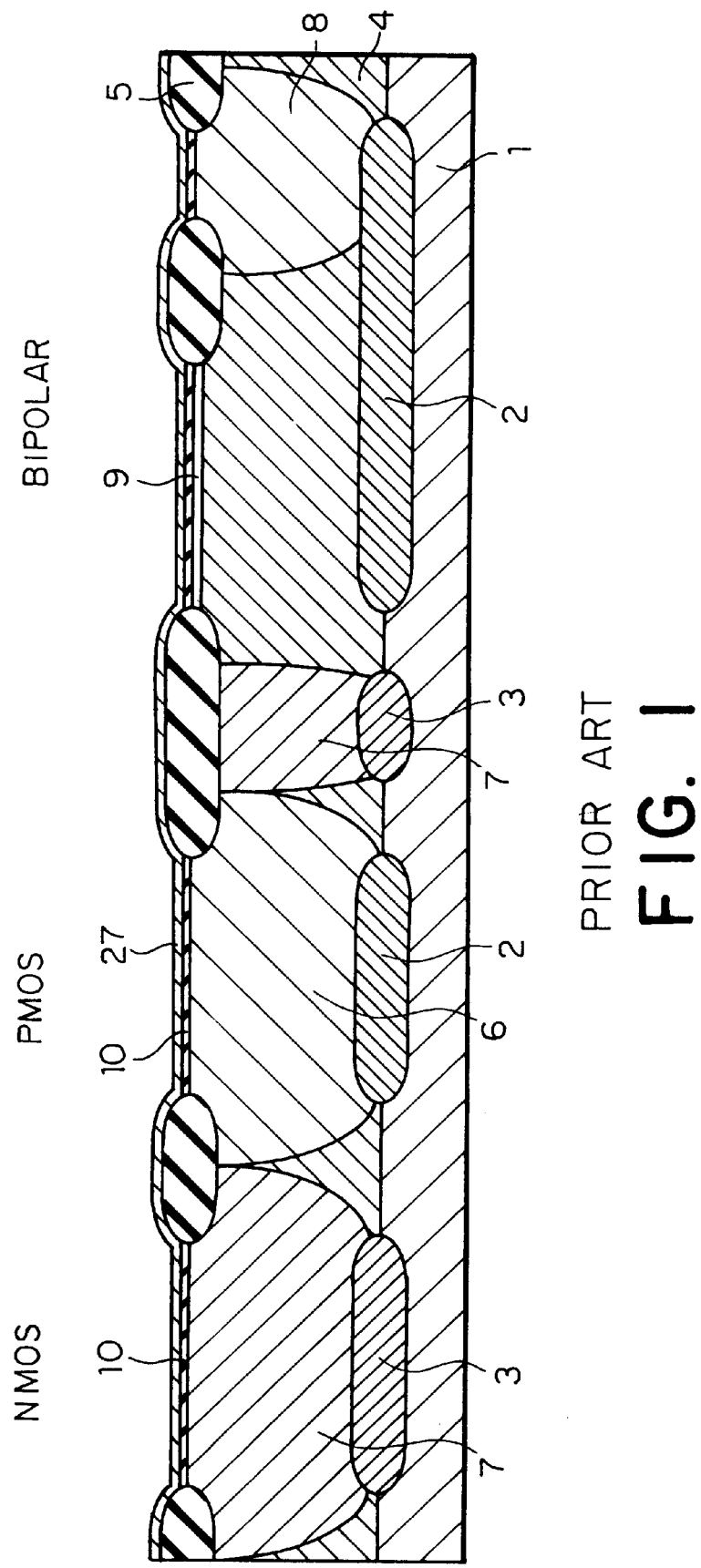
FIG. 1 is a sectional view for explaining a first fabricating process of a known method of fabricating a semiconductor device.

In FIG. 1, an n-type epitaxial layer 4 is first grown on a silicon substrate 1 which is formed in advance with $n^+$ buried layers 2 and $p^+$ buried layers 3. Then, using the LOCOS method, field oxidized films 5 are formed. Subsequently, an n-type well region 6, a p-type well region 7, an $n^+$-type collector leading region 8 and a base region 9 of a bipolar transistor are formed. Then, just after formation of gate oxidized films 10, each in a thickness of 50 to 200 angstroms, of NMOS and PMOS transistors, a polysilicon layer 27 is grown to a thickness of 500 to 1,000 angstroms. This polysilicon layer 27 is provided for preventing a problem, such as a resistance failure of the gate oxidized films 10 due to contamination or damage thereof in a subsequent process of forming an emitter contact 12. The technique of forming the polysilicon layer immediately after formation of the gate oxidized films is disclosed, for example, in Japanese Unexamined Patent Publication No. 4-373163.

Figure 2:
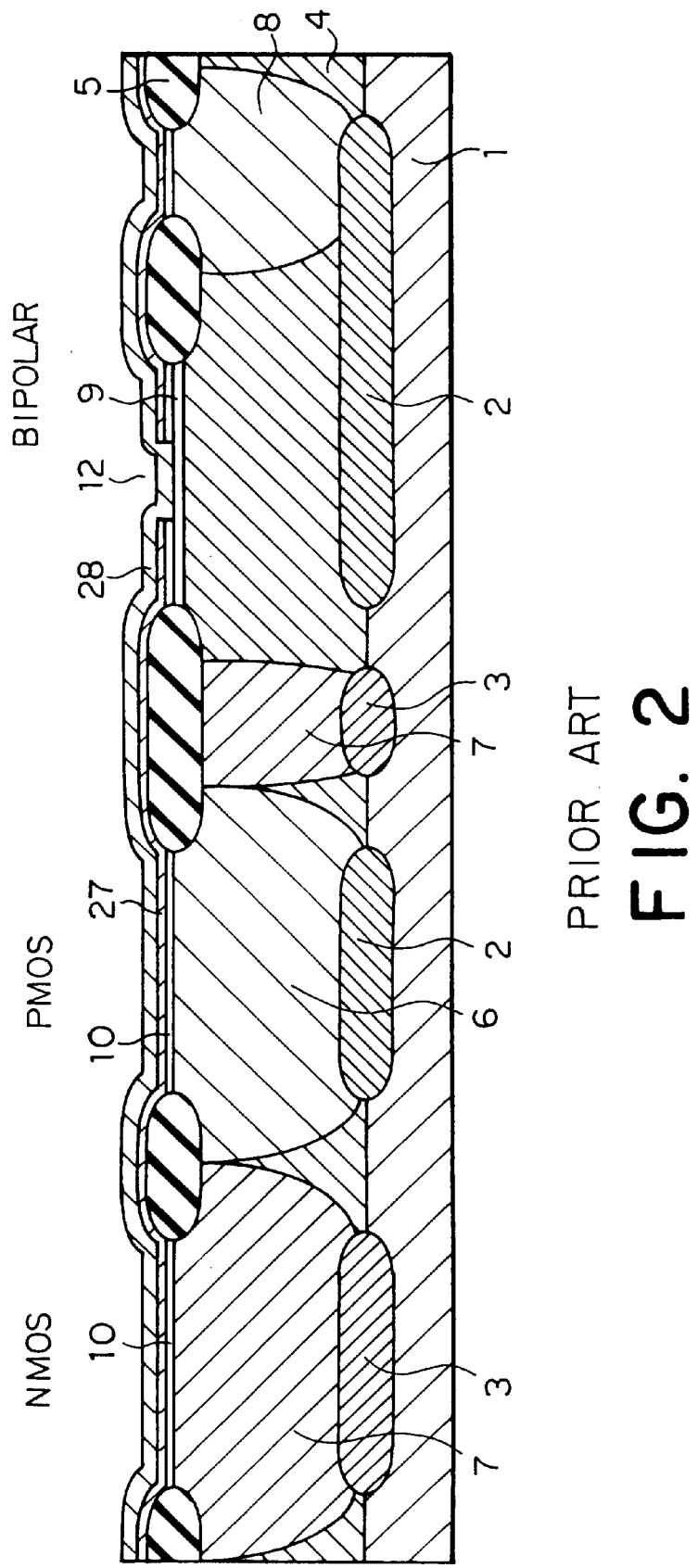
FIG. 2 is a sectional view for explaining a second fabricating process of the known method of fabricating the semiconductor device.

Subsequently, as shown in FIG. 2, the polysilicon layer 27 and the gate oxidized film 10 at an emitter region of the bipolar transistor are etched to form the emitter contact 12, and then a polysilicon layer 28 is deposited to a thickness of 1,000 to 2,000 angstroms over the whole area.

Figure 3:
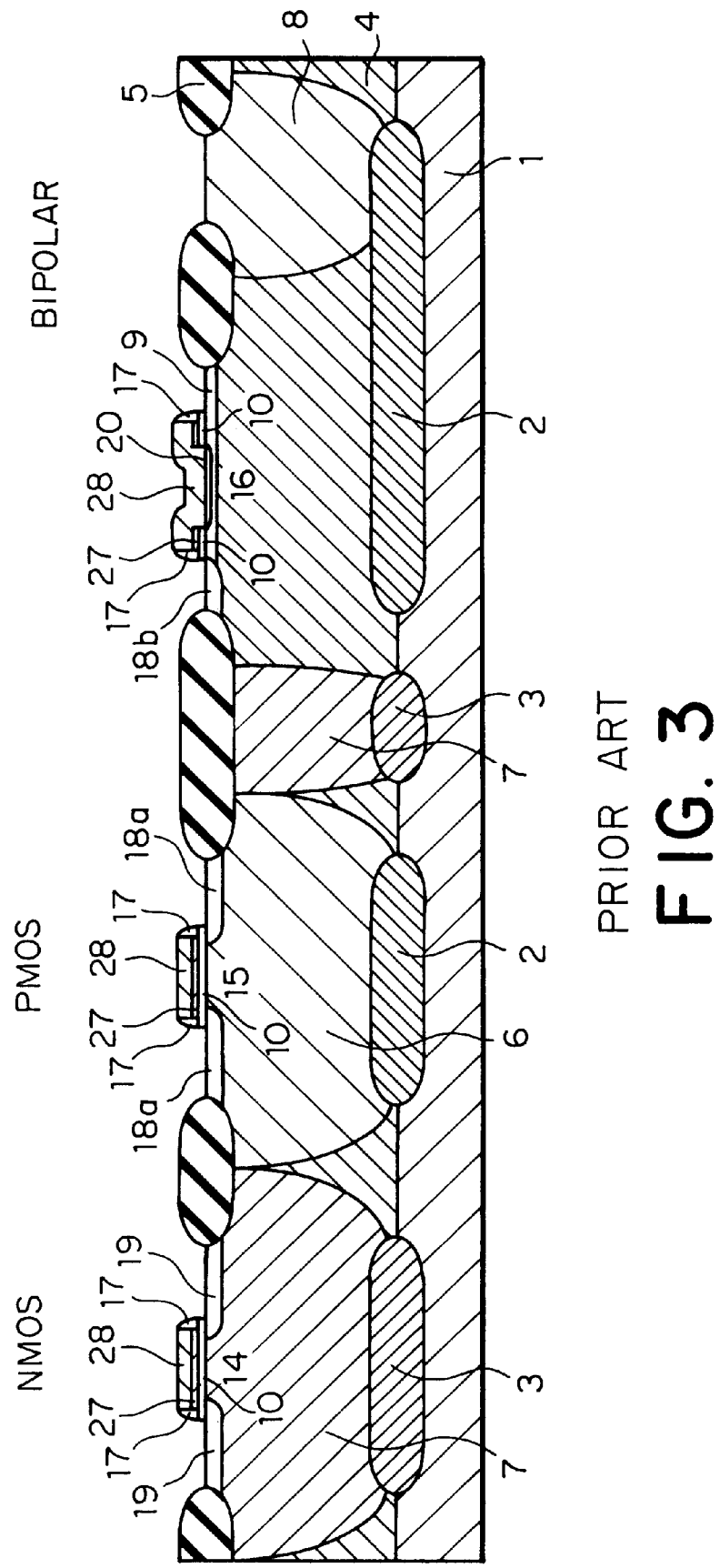
FIG. 3 is a sectional view for explaining a third fabricating process of the known method of fabricating the semiconductor device.

Subsequently, as shown in FIG. 3, the polysilicon layers 28 and 27 are etched to form a gate electrode 14 of the NMOS transistor, a gate electrode 15 of the PMOS transistor and an emitter electrode 16 of the bipolar transistor. Thereafter, an oxidized film is deposited to a thickness of 1,000 angstroms, and then anisotropic dry etching is performed so as to form side walls 17 on the sides of each of the gate electrodes 14 and 15 and the emitter electrode 16. Subsequently, boron is doped through ion implantation at concentration of $5 \times 10^{15}$ cm$^{-2}$ to $7 \times 10^{15}$ cm$^{-2}$ into source and drain regions 18a and the gate electrode 15 of the PMOS transistor and an external base region 18b of the bipolar transistor. On the other hand, arsenic is doped through ion implantation at concentration of $1 \times 10^{16}$ cm$^{-2}$ to $2 \times 10^{16}$ cm$^{-2}$ into source and drain regions 19 and the gate electrode 14 of the NMOS transistor and the emitter electrode 16. Thereafter, the heat treatment is applied in the nitrogen atmosphere at 850 to 900° C. so as to activate the implanted impurities. Then, at the gate electrode 15 of the PMOS transistor, boron diffuses from the upper polysilicon layer 28 into the lower polysilicon layer 27 so that the p-type gate electrode is formed. On the other hand, at the gate electrode 14 of the NMOS transistor, arsenic diffuses from the upper polysilicon layer 28 into the lower polysilicon layer 27 so that the n-type gate electrode is formed. Further, at the emitter electrode 16 of the bipolar transistor, arsenic diffuses from the upper polysilicon layer 28 into the base region 9 so that an emitter region 20 of the bipolar transistor is formed.

Then, an interlayer insulation film 21 is deposited on the elements formed in the foregoing processes. After forming contact holes through the interlayer insulation film 21, plugs 22 are formed of tungsten or the like and metallic wiring 23 is arranged so that a semiconductor device is achieved as shown in FIG. 4.

Figure 4:
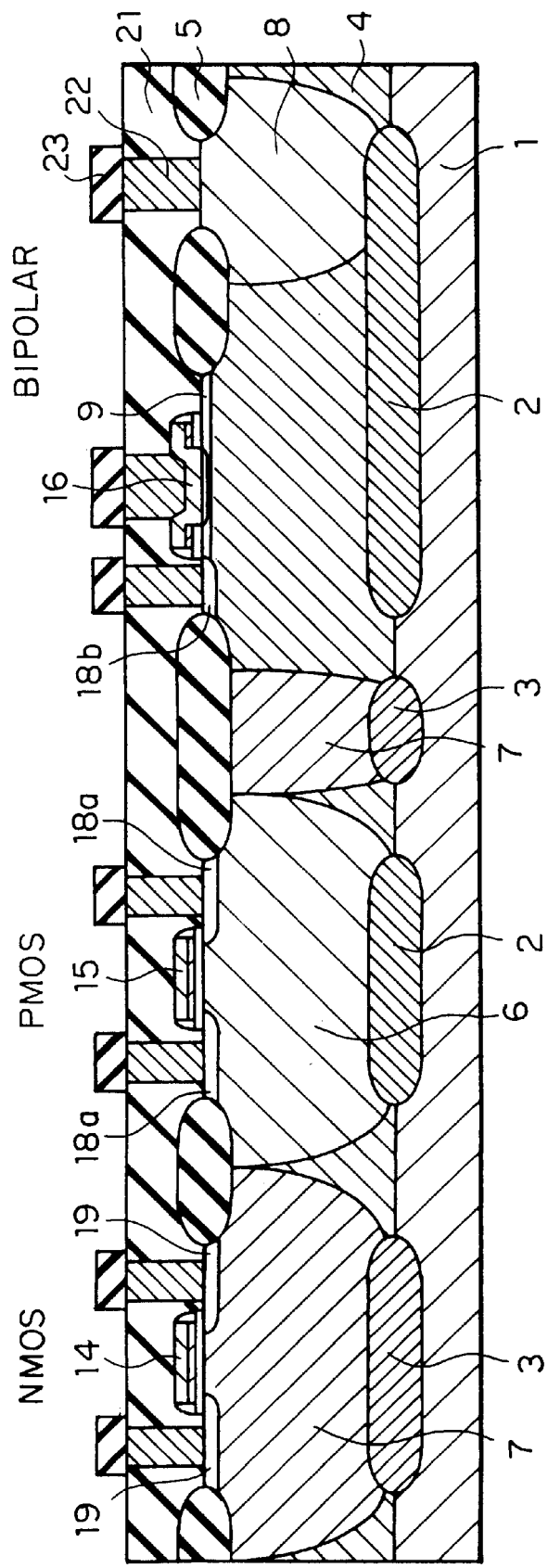
FIG. 4 is a sectional view showing a final structure of the semiconductor device fabricated by the known method.

However, the conventional semiconductor device shown in FIG. 4 and the fabricating method thereof have the aforementioned problems, such as the dispersion of the threshold voltages of the PMOS transistors due to the punch-through of boron and the lowering in characteristic of the NMOS transistor and the bipolar transistor due to formation of the spontaneous oxidized thin film on the surface of the lower polysilicon layer 27.

Now, preferred embodiments of the present invention will be described hereinbelow with reference to FIGS. 5 to 12.

FIGS. 5 through 8 show fabricating processes, respectively, of a method of fabricating a semiconductor device according to a first preferred embodiment of the present invention.

Figure 5:
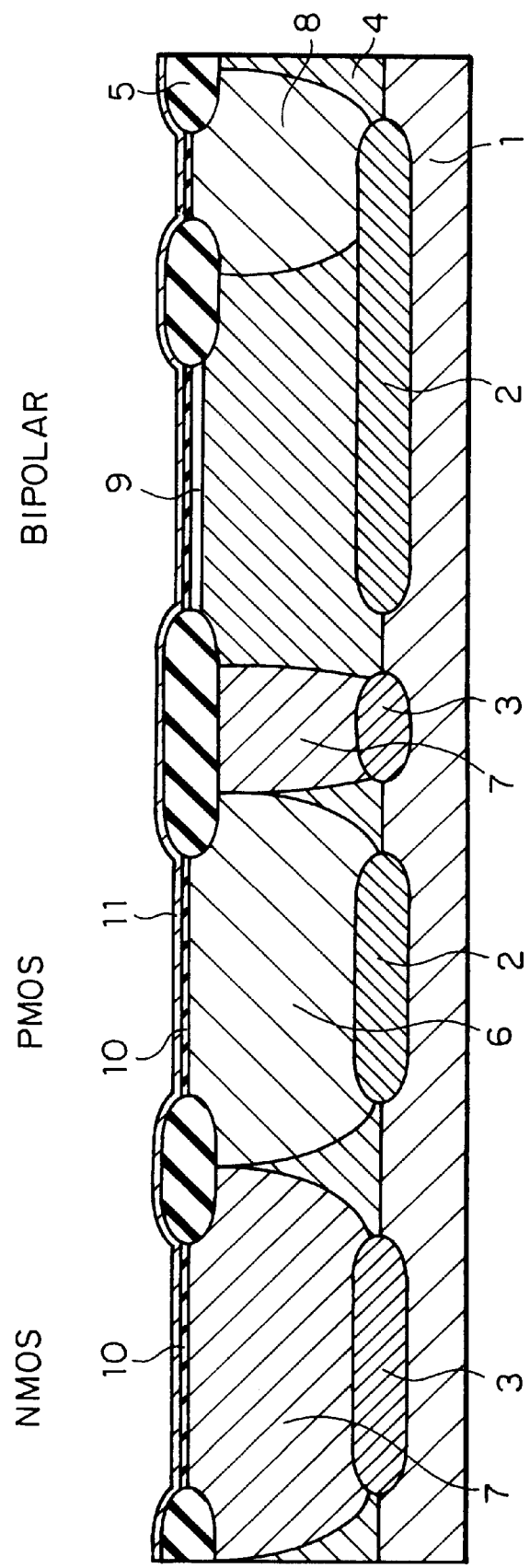
FIG. 5 is a sectional view for explaining a first fabricating process of a method of fabricating a semiconductor device according to a first preferred embodiment of the present invention.

In FIG. 5, an n-type epitaxial layer 4 is first grown on a p-type silicon substrate 1 which is formed in advance with n$^+$ buried layers 2 and p buried layers 3. Then, using the LOCOS method, field oxidized films 5 are formed. Subsequently, an n-type well region 6, a p-type well region 7, an n$^+$-type collector leading region 8 and a base region 9 of a bipolar transistor are formed. Then, after formation of gate oxidized films 10, each in a thickness of 50 to 200 angstroms, of NMOS and PMOS transistors, a polysilicon layer 11 is grown to a thickness of 500 to 1,000 angstroms over the whole area. Subsequently, arsenic is doped into the polysilicon layer 11 through ion implantation. The doping amount of arsenic is set to $2 \times 10^{15}$ cm$^{-2}$ to $6 \times 10^{15}$ cm$^{-2}$ for preventing a depletion layer from expanding upon application of the voltage across a gate electrode of the NMOS transistor. Instead of the ion implantation, the in situ method or another method may be used for doping arsenic into the polysilicon layer 11 as long as the arsenic concentration in the polysilicon layer 11 can be set equal to the ion implantation. In the in situ method, arsenic is doped simultaneously with growing the polysilicon layer 11 by the method of CVD (chemical vapor deposition). Further, in stead of arsenic, phosphorus or antimony, which is an n-type impurity, may be used as impurities to be doped.

Figure 6:
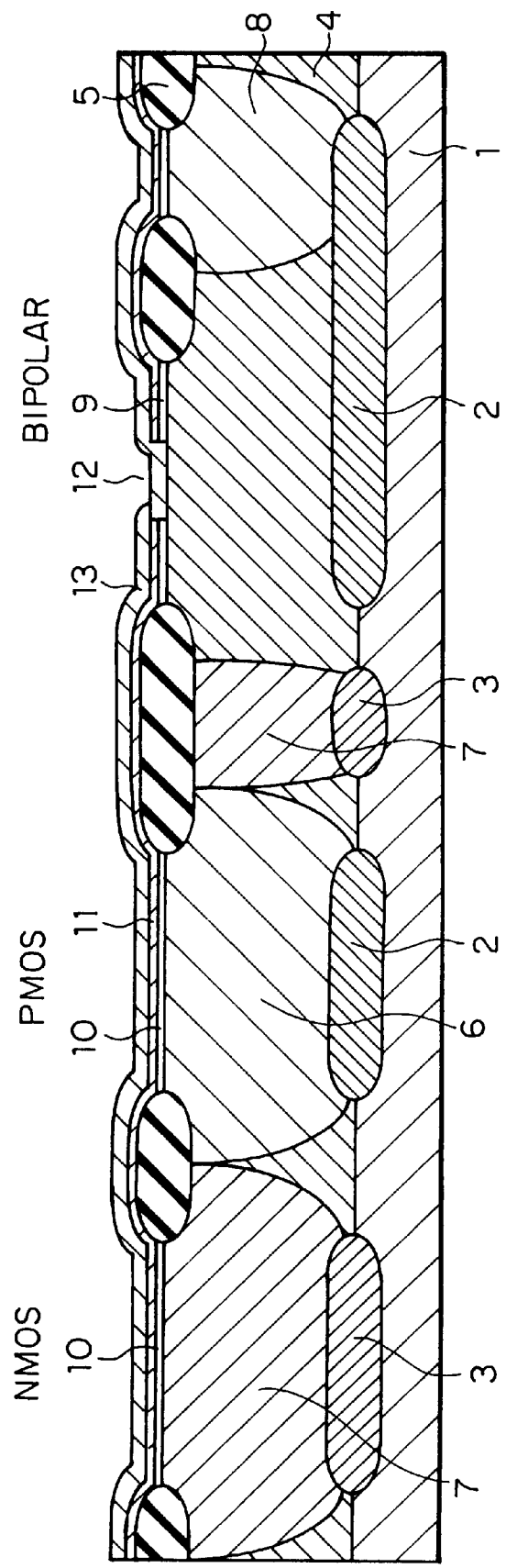
FIG. 6 is a sectional view for explaining a second fabricating process of the method of fabricating the semiconductor device according to the first preferred embodiment.

Subsequently, as shown in FIG. 6, the polysilicon layer 11 and the gate oxidized film 10 at an emitter region of the bipolar transistor are etched to form an emitter contact 12, and then a polysilicon layer 13 doped with arsenic is formed to a thickness of 1,000 to 2,000 angstroms over the whole area.

Figure 7:
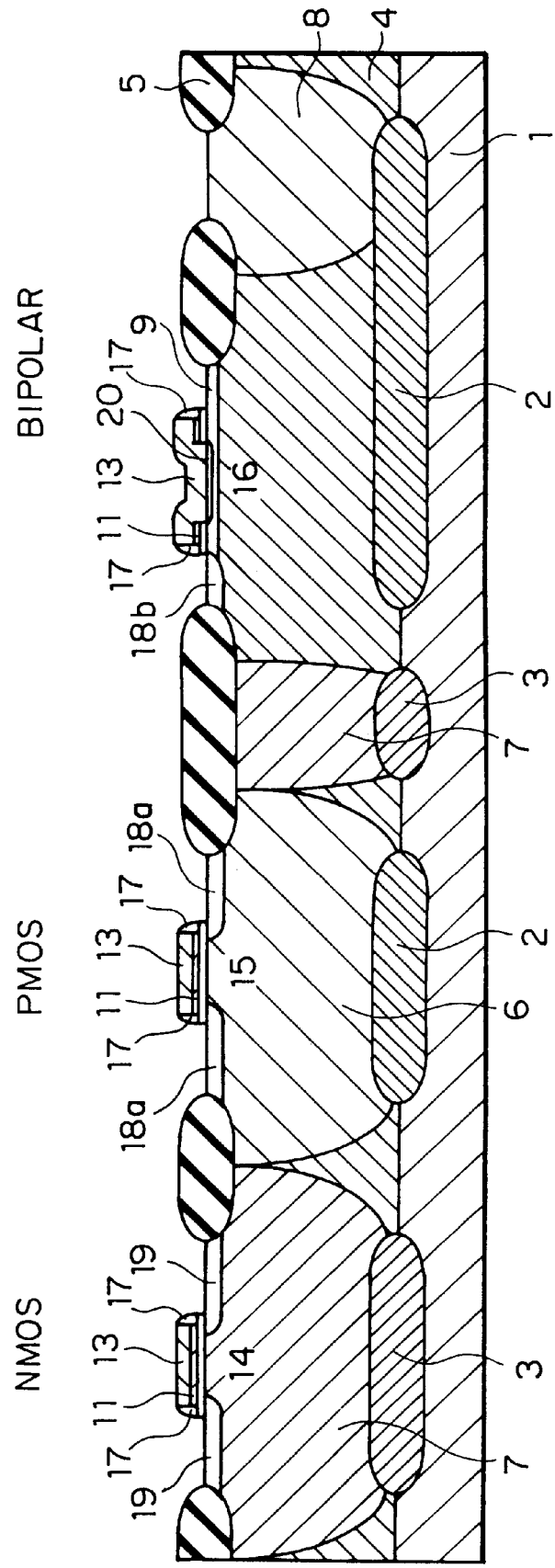
FIG. 7 is a sectional view for explaining a third fabricating process of the method of fabricating the semiconductor device according to the first preferred embodiment.

Subsequently, as shown in FIG. 7, the polysilicon layers 13 and 11 are etched to form a gate electrode 14 of the NMOS transistor, a gate electrode 15 of the PMOS transistor and an emitter electrode 16 of the bipolar transistor. Thereafter, an oxidized film is deposited to a thickness of 1000 angstroms, and then anisotropic dry etching is performed so as to form side walls 17 on the sides of each of the gate electrodes 14 and 15 and the emitter electrode 16. Subsequently, boron is doped through ion implantation at concentration of $5 \times 10^{15}$ cm$^{-2}$ to $9 \times 10^{15}$ cm$^{-2}$ into source and drain regions 18a and the gate electrode 15 of the PMOS transistor and an external base region 18b of the bipolar transistor. On the other hand, arsenic is doped through ion implantation at concentration of $1 \times 10^{16}$ cm$^{-2}$ to $2 \times 10^{16}$ cm$^{-2}$ into source and drain regions 19 and the gate electrode 14 of the NMOS transistor and the emitter electrode 16. Instead of arsenic, phosphorus may be used. Thereafter, the heat treatment is applied in the nitrogen atmosphere at 850 to 900° C. so as to activate the implanted impurities. Then, at the gate electrode 15 of the PMOS transistor, boron diffuses from the upper polysilicon layer 13 into the lower polysilicon layer 11 to compensate for the n-type impurities in the lower polysilicon layer 11 so that the p-type gate electrode is formed. On the other hand, at the emitter electrode 16 of the bipolar transistor, arsenic diffuses from the upper polysilicon layer 13 into the base region 9 so that an emitter region 20 of the bipolar transistor is formed. In the bipolar transistor thus structured, arsenic diffuses into the emitter region also from the polysilicon layer 11 formed on the gate oxidized film 10 around the emitter contact 12 so that the arsenic concentration at the emitter region can be increased. This improves the current amplification factor of the bipolar transistor and reduces the emitter resistance.

Figure 8:
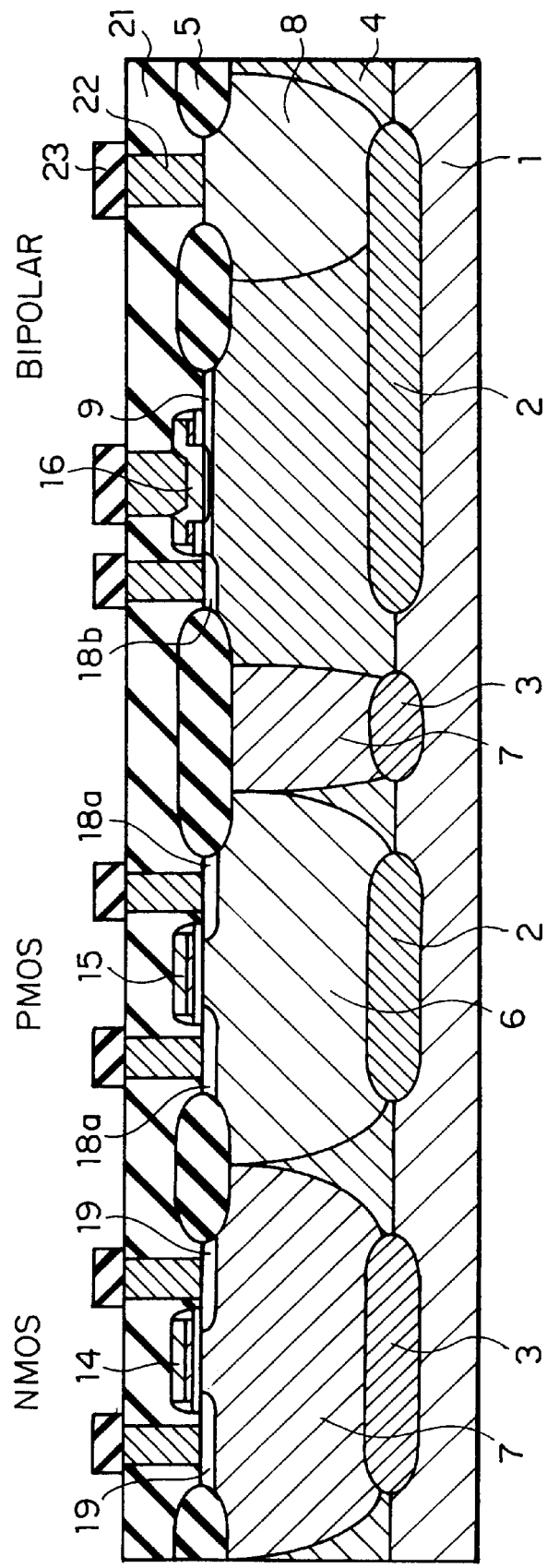
FIG. 8 is a sectional view showing a final structure of the semiconductor device according to the first preferred embodiment.

Then, an interlayer insulation film 21 is deposited on the elements formed in the foregoing processes. After forming contact holes through the interlayer insulation film 21, plugs 22 are formed of tungsten or the like and metallic wiring 23 is arranged so that a semiconductor device is achieved as shown in FIG. 8.

Figure 9:
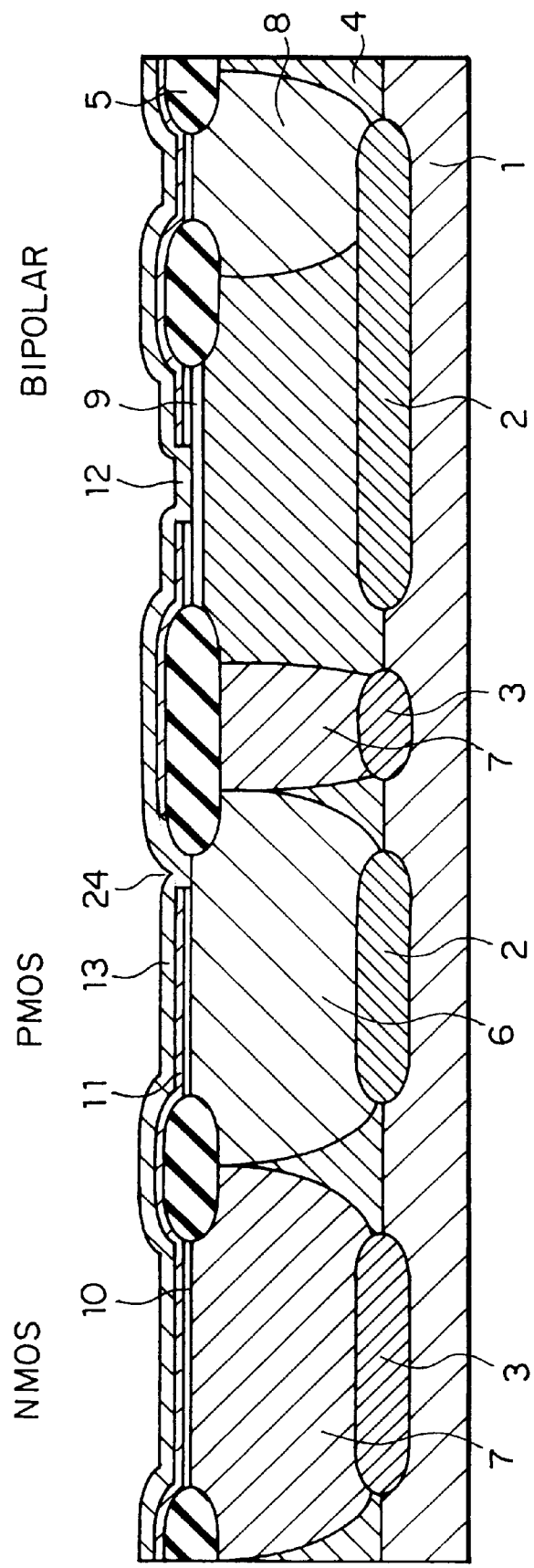
FIG. 9 is a sectional view for explaining a first fabricating process of a method of fabricating a semiconductor device according to a second preferred embodiment of the present invention.
Figure 10:
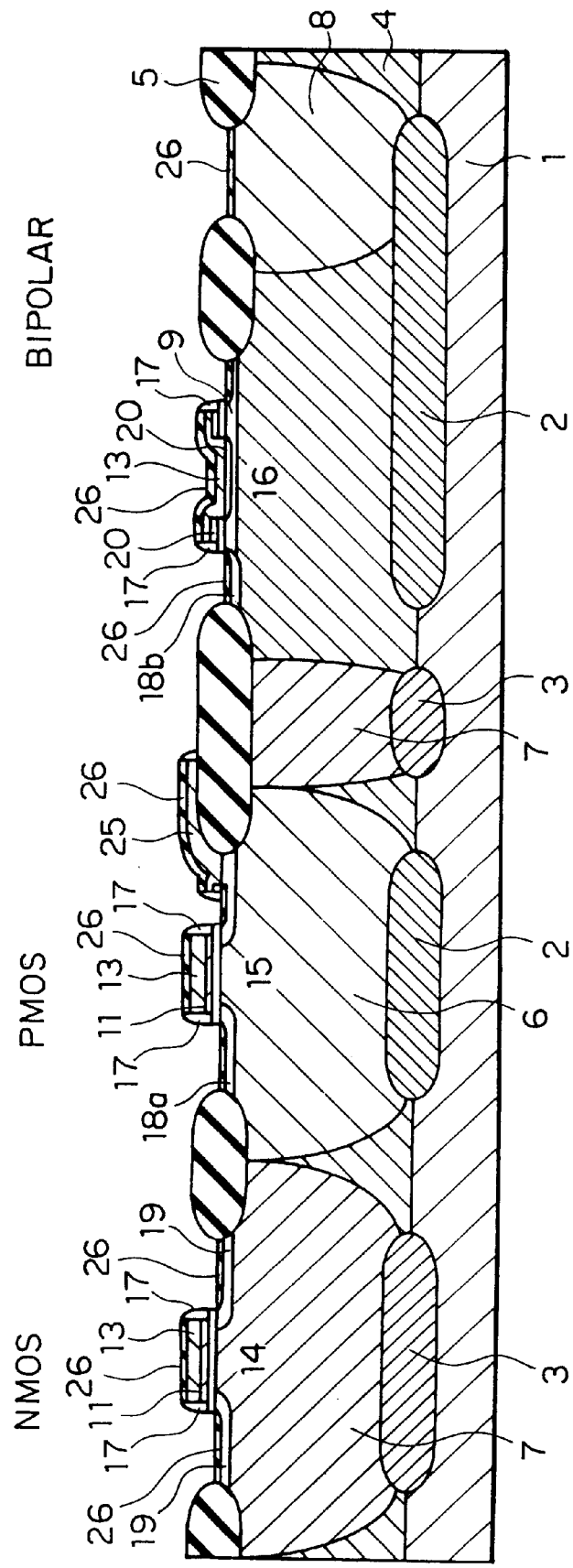
FIG. 10 is a sectional view for explaining a second fabricating process of the method of fabricating the semiconductor device according to the second preferred embodiment.
Figure 11:
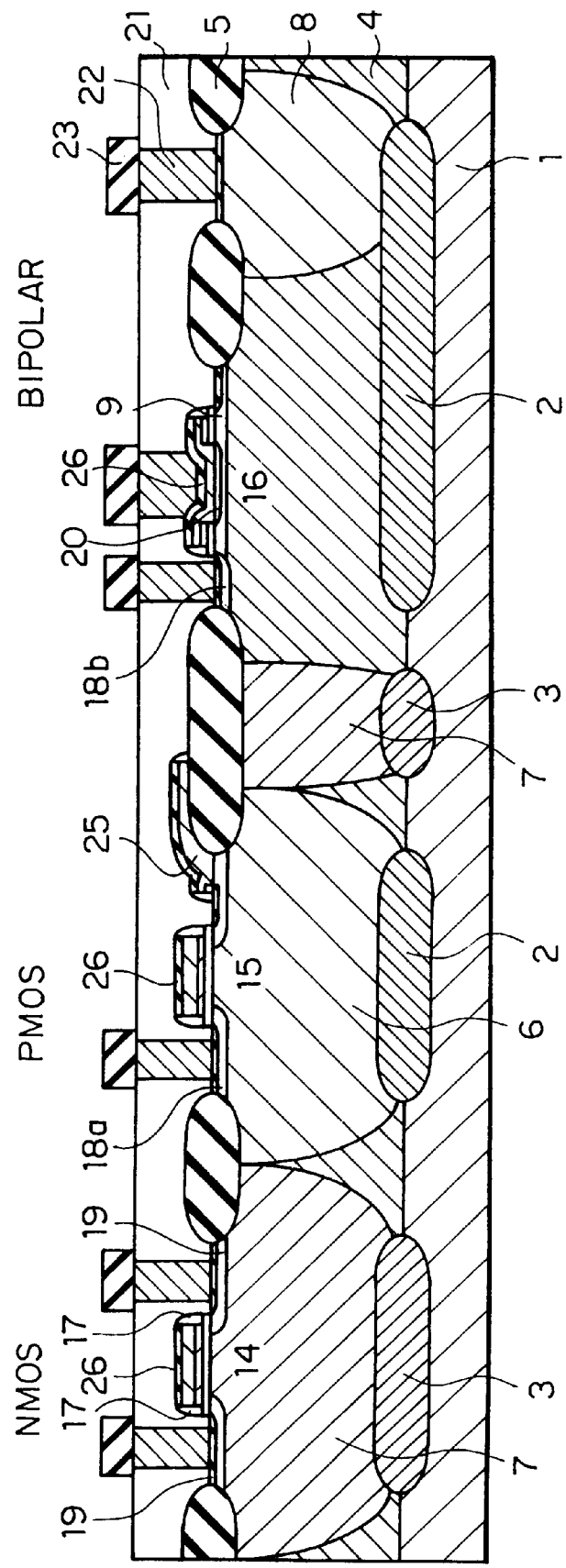
FIG. 11 is a sectional view showing a final structure of the semiconductor device according to the second preferred embodiment.

FIGS. 9 through 11 show fabricating processes, respectively, of a method of fabricating a semiconductor device according to a second preferred embodiment of the present invention. In the second preferred embodiment, the fabricating process as represented by FIG. 5 is also applied.

In FIG. 9, subsequent to the fabricating process shown in FIG. 5, the polysilicon layer 11 and the gate oxidized layers 10 are etched at an emitter region of the bipolar transistor and at a portion of a source/drain scheduled region of the MOS transistor so as to form an emitter contact 12 and a direct contact 24. Then, a polysilicon layer 13 is deposited to a thickness of 1,000 to 2,000 angstroms over the whole area. The direct contact 24 has a contact structure which has been used for leading out an electrode from a transistor diffusion region inside a memory cell.

Subsequently, as shown in FIG. 10, the polysilicon layers 13 and 11 are etched to form a gate electrode 14 of the NMOS transistor, a gate electrode 15 of the PMOS transistor, a direct contact leading electrode 25 and an emitter electrode 16 of the bipolar transistor. Thereafter, an oxidized film is deposited to a thickness of 1,000 angstroms, and then anisotropic dry etching is performed so as to form side walls 17 on the sides of each of the gate electrodes 14 and 15, the direct contact leading electrode 25 and the emitter electrode 16. Subsequently, boron is doped through ion implantation at concentration of $5\times10^{15}$ cm$^{-2}$ to $9\times10^{15}$ cm$^{-2}$ into source and drain regions 18a and the gate electrode 15 of the PMOS transistor and an external base region 18b of the bipolar transistor. On the other hand, arsenic or phosphorus is doped through ion implantation at concentration of $2\times10^{5}$ cm$^{-2}$ to $4\times10^{15}$ cm$^{-2}$ into source and drain regions 19 and the gate electrode 14 of the NMOS transistor and the direct contact leading electrode 25. Further, arsenic or phosphorus is doped through ion implantation at concentration of $1\times10^{16}$ cm to $2\times10^{16}$ cm$^{-2}$ into the emitter electrode 16 of the bipolar transistor. Thereafter, the heat treatment is applied in the nitrogen atmosphere at 850 to 900° C. so as to activate the implanted impurities. Then, at the gate electrode 15 of the PMOS transistor, boron diffuses from the upper polysilicon layer 13 into the lower polysilicon layer 11 to compensate for the n-type impurities in the lower polysilicon layer 11 so that the whole gate electrode 15 can be formed into p-type. On the other hand, at the emitter electrode 16 of the bipolar transistor, arsenic or phosphorus diffuses from the upper polysilicon layer 13 into the n-type epitaxial layer 4 so that an emitter region 20 of the bipolar transistor is formed. Further, at the direct contact leading electrode 25, arsenic or phosphorus fully diffuses from the polysilicon layer 13 into the silicon substrate so that the contact resistance is reduced. Subsequently, a titanium film in a thickness of about 200 angstroms is formed over the whole area through sputtering or the like and then subjected to the heat treatment so as to form a silicide layer 26 on the source and drain regions 18a of the PMOS transistor, the external base region 18b of the bipolar transistor, the source and drain regions 19 of the NMOS transistor and the polysilicon layers of the gate electrodes 14 and 15, the direct contact leading electrode 25 and the emitter electrode 16.

Figure 12:
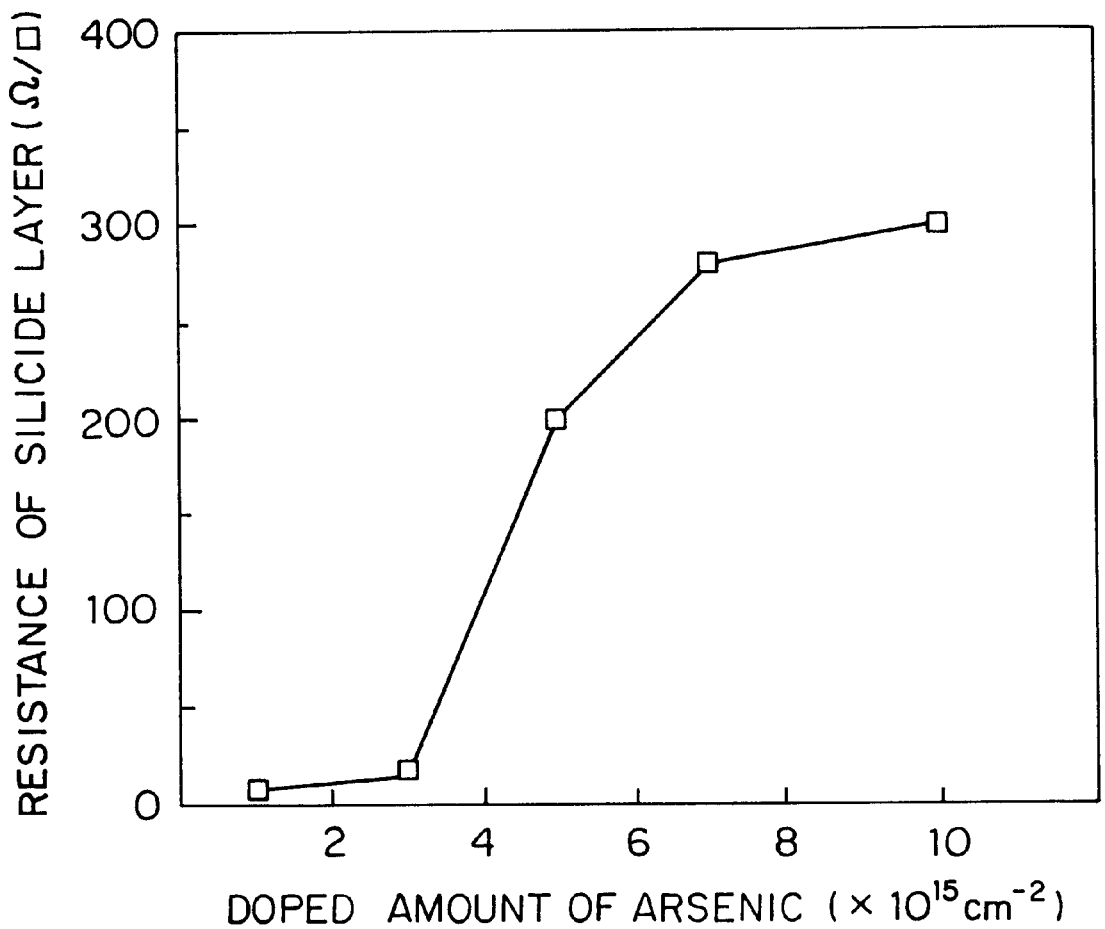
FIG. 12 is a graph showing a relationship between a resistance of a silicide layer and a doping amount of arsenic.

The resistance of the silicide layer is largely affected by the doped amount of arsenic into the polysilicon layer. FIG. 12 shows a relationship therebetween. Accordingly, the silicide layer having a low resistance can be formed on the gate electrode 14 of the NMOS transistor and the direct contact leading electrode 25 where the doped amount of arsenic into the polysilicon layer 13 is $2\times10^{15}$ cm$^{-2}$ to $4\times10^{15}$ cm$^{-2}$ which is low. On the other hand, on the emitter electrode 16 where the arsenic dopes amount is $1\times10^{16}$ cm to $2\times10^{16}$ cm$^{-2}$ which is high, the silicide reaction is suppressed so that a thickness of the silicide layer is rendered thin. Thus, the silicide layer on the emitter electrode has a resistance higher than the silicide layer on the gate electrode. However, since the minimum width of the emitter electrode is normally 2 to 3 micrometers which is about ten times that of the gate electrode of the MOS transistor (0.2 to 0.3 micrometers), no problem is raised from a practical point of view.

Then, an interlayer insulation film 21 is deposited on the elements formed in the foregoing processes. After forming contact holes through the interlayer insulation film 21, plugs 22 are formed of tungsten or the like and metallic wiring 23 is arranged so that a semiconductor device is achieved as shown in FIG. 11.

According to the foregoing second preferred embodiment, not only the low-resistance silicide layer can be formed at the CMOS transistor portion, but also the resistance of the emitter contact of the bipolar transistor and the resistance of the direct contact leading electrode can be simultaneously reduced without increasing the number of fabrication processes.

In the foregoing first and second preferred embodiments, as described before, the n-type impurities doped into the lower polysilicon layer can be selected from among arsenic, phosphorus, antimony and the like. However, phosphorus is optimum in view of its small impurity segregation into the polysilicon grain boundary and its high controllability even at the low concentration. On the other hand, as the n-type impurities doped into the upper polysilicon layer, arsenic is appropriate for forming the emitter diffusion layer with a smaller depth so as to improve the characteristic of the bipolar transistor, while phosphorus is appropriate for reducing the resistance of the direct contact. Further, the relationship between the impurities and the silicide layer resistance as shown in FIG. 12 can be improved in titanium silicification by doping phosphorus. In this regard, phosphorus and arsenic can be selectively used depending on the desired or required transistor characteristics as the impurities to be doped into the upper and lower polysilicon layers, respectively. Thus, it is possible that the impurities doped into the upper and lower polysilicon layers are of the same conductivity type but of different kinds.

In the foregoing first and second preferred embodiments, it may be arranged that the conductivity types of the impurities to be doped are exchanged with each other. Further, the order of doping the impurities into the polysilicon layers of the PMOS gate electrode, the NMOS gate electrode and the emitter electrode is not limited to that shown in the preferred embodiments.

According to the foregoing first and second preferred embodiments, arsenic (n-type impurity) is doped into the lower polysilicon layer of the p-type gate electrode of the CMOS transistor portion. Thus, even if boron (p-type impurity) diffuses from the upper polysilicon layer into the lower polysilicon layer to render it of p-type, the arsenic atoms included in the lower polysilicon layer trap the boron atoms to suppress further diffusion of boron. Accordingly, the punch-through of boron into the silicon substrate via the gate oxidized film is effectively prevented. As a result, the fluctuation of the transistor characteristic can be suppressed.

Further, even if the thin oxidized film is formed between the upper and lower polysilicon layers forming the n-type gate electrode, since the high-concentration n-type impurities are doped in advance into the lower polysilicon layer, the expansion of the depletion layer in the gate electrode can be prevented.

Further, in the bipolar transistor portion, since arsenic fully diffuses into the emitter region also from the lower polysilicon layer near the emitter contact, the arsenic concentration at the emitter region can be rendered high so that the high current amplification factor and the fully low emitter resistance can be achieved.

What is claimed is:

1. A semiconductor device comprising;

complementary first and second MOS transistors of different conductivity types and a bipolar transistor formed on a common substrate, said first MOS transistor having a first gate electrode comprising a polysilicon layer doped with impurities of a first conductivity type and a second conductivity type, a concentration of said first conductivity type being higher than that of said second conductivity type, and said second MOS transistor having a second gate electrode comprising a polysilicon layer doped with impurities of a plurality of different dopant materials of said second conductivity type, where a source region and a drain region of said second MOS transistor are doped only with a single dopant material, and said bipolar transistor having an emitter electrode comprising a polysilicon layer doped with impurities of said second conductivity type.

2. A semiconductor device as claimed in claim 1, wherein said polysilicon layers of said first and second gate electrodes and said emitter electrode each comprise a first sublayer and a second sublayer overlying said first sublayer wherein said first sublayer of said emitter electrode is partially etched prior to the application of said second sublayer.

3. A semiconductor device as claimed in claim 1, wherein said impurities of said second conductivity type doped into the polysilicon layer of said first gate electrode comprise a single kind of impurities.

4. A semiconductor device as claimed in claim 3, wherein said single kind of impurities, which comprise said impurities of said second conductivity type doped into the polysilicon layer of said first gate electrode, are the same type of impurities as one of said plurality of different impurities.

* * * * *